United States Patent
Chen et al.

(10) Patent No.: US 10,253,963 B2
(45) Date of Patent: Apr. 9, 2019

(54) LED MODULE WITH HIGH FLAME RETARDANT GRADE

(71) Applicant: HANGZHOU HPWINNER OPTO CORPORATION, Hangzhou, Zhejiang Province (CN)

(72) Inventors: Kai Chen, Hangzhou (CN); Jianming Huang, Hangzhou (CN)

(73) Assignee: HANGZHOU HPWINNER OPTO CORPORATION, Hangzhou, Zhejiang Province (CN)

( * ) Notice: Subject to any disclaimer, the term of this patent is extended or adjusted under 35 U.S.C. 154(b) by 0 days.

(21) Appl. No.: 15/569,067

(22) PCT Filed: Apr. 27, 2016

(86) PCT No.: PCT/CN2016/080432
§ 371 (c)(1),
(2) Date: Oct. 24, 2017

(87) PCT Pub. No.: WO2016/173499
PCT Pub. Date: Nov. 3, 2016

(65) Prior Publication Data
US 2018/0135846 A1    May 17, 2018

(30) Foreign Application Priority Data

Apr. 27, 2015 (CN) ...................... 2015 2 0265720 U
Mar. 11, 2016 (CN) .......................... 2016 1 0140714

(51) Int. Cl.
*F21V 25/12*    (2006.01)
*F21V 5/04*    (2006.01)
(Continued)

(52) U.S. Cl.
CPC .............. *F21V 25/12* (2013.01); *F21V 5/007* (2013.01); *F21V 5/048* (2013.01); *F21V 17/101* (2013.01);
(Continued)

(58) Field of Classification Search
None
See application file for complete search history.

(56) References Cited

U.S. PATENT DOCUMENTS

2015/0008455 A1*  1/2015 Tozawa ................... H01L 33/60
                                                         257/88
2015/0330610 A1* 11/2015 Song ....................... F21V 25/12
                                                           362/6

FOREIGN PATENT DOCUMENTS

CN    101534599 A    9/2009
CN    201954387 U    8/2011
(Continued)

*Primary Examiner* — Ashok Patel
(74) *Attorney, Agent, or Firm* — Muncy, Geissler, Olds & Lowe, P.C.

(57) ABSTRACT

An LED module with high flame retardant grade includes a base, lens group, flame retardant film and at least one LED luminary unit. The flame retardant film is provided on a first side of the base with at least one hole on the flame retardant film. The LED luminary unit is provided on the first side of the base and passes through the hole with the lens group being covered onto the first side of the base. A first closed space is formed between the lens group and base. The flame retardant film can effectively cut off circuit sparks generated by a circuit layer or by a PCB board on the base, effectively reducing security risks. The module has a high flame retardant grade after being provided with the flame retardant film and the LED module has a simple structure and is easy to process and implement.

16 Claims, 3 Drawing Sheets

(51) Int. Cl.
*F21V 29/76* (2015.01)
*F21V 17/10* (2006.01)
*F21V 17/16* (2006.01)
*F21V 31/00* (2006.01)
*F21V 5/00* (2018.01)
*H05K 3/28* (2006.01)
*H05K 1/18* (2006.01)
*F21V 19/00* (2006.01)
*F21Y 105/10* (2016.01)
*F21Y 113/10* (2016.01)
*F21Y 115/10* (2016.01)
*F21W 131/107* (2006.01)
*H01L 33/50* (2010.01)
*H01L 33/62* (2010.01)
*H05K 1/02* (2006.01)

(52) U.S. Cl.
CPC ............ *F21V 17/16* (2013.01); *F21V 29/763* (2015.01); *F21V 29/767* (2015.01); *F21V 31/005* (2013.01); *H05K 3/281* (2013.01); *F21V 19/003* (2013.01); *F21W 2131/107* (2013.01); *F21Y 2105/10* (2016.08); *F21Y 2113/10* (2016.08); *F21Y 2115/10* (2016.08); *H01L 33/50* (2013.01); *H01L 33/62* (2013.01); *H05K 1/0203* (2013.01); *H05K 1/181* (2013.01); *H05K 2201/012* (2013.01); *H05K 2201/066* (2013.01); *H05K 2201/10106* (2013.01)

(56) References Cited

FOREIGN PATENT DOCUMENTS

| | | | |
|---|---|---|---|
| CN | 104180192 | A | 12/2014 |
| CN | 104359033 | A | 2/2015 |
| CN | 204513064 | U | 7/2015 |
| CN | 204573936 | * | 8/2015 |
| CN | 204573936 | U | 8/2015 |
| JP | 2015076585 | A | 4/2015 |

\* cited by examiner

LED MODULE WITH HIGH FLAME RETARDANT GRADE

TECHNICAL FIELD

The present invention relates to the LED field, and more particularly to an LED module with high flame retardant grade.

BACKGROUND ART

An LED module is a product formed by the light emitting diodes arranged according to certain rules, then packaged, and added with some waterproof treatment.

An LED module is a widely used product in LED products, and is also very different in terms of structure and electronics. A simple LED module is formed by a wiring board mounted with an LED and a housing, while a complex LED module is configured with some control, a constant current source and a related heat dissipation treatment to achieve longer LED life and better luminous intensity.

However, as the use environment of an LED module is increasingly diversified, for example an LED module is often used for exterior walls of high-rise buildings in terms of outdoor use, thus requirements for fireproofing performance of the LED module and a lighting device is relatively higher. Therefore, a higher requirement for flame retardant performance of an LED module has been put forward in real life.

SUMMARY OF THE INVENTION

A technical problem to be solved by the present invention is how to improve the flame retardant performance of an LED module.

To solve this problem, the present invention provides an LED module with high flame retardant grade, the LED module including a base and a lens group and further including a flame retardant film, a lens group and at least one LED luminary unit, wherein the flame retardant film is provided on a first side of the base with at least one hole being provided on the flame retardant film, the LED luminary unit is provided on the first side of the base and passes through the hole with the lens group being covered onto the first side of the base, and a first closed space is formed between the lens group and the base.

Optionally, the LED module further includes a printed circuit layer provided on the first side of the base, the LED luminary unit being electrically connected with the printed circuit layer, and the flame retardant film covering the printed circuit layer.

Optionally, the printed circuit layer is located only in the first closed space between the lens group and the base.

Optionally, the LED module further includes a PCB board provided on the base, the PCB board being located between the base and the lens group, the flame retardant film covering on the PCB board, and the at least one LED luminary unit being provided on the PCB board.

Optionally, the lens group comprises a lens and a connection portion, the lens being used for photometry of the LED luminary unit, the first closed space being located between the lens and the base, and the connection portion being used for connecting the lens group and the base.

Optionally, a circle of glue is provided between the connection portion and the base, the glue being respectively bonded to the lens group and the base.

Optionally, a seal ring is provided between the base and the lens group, the first closed space being located on the inner side of the seal ring.

Optionally, a circle of glue is provided on the inner side or on the outer side of the seal ring and between the base and the lens group, the glue being respectively bonded to the lens group and the base.

Optionally, the lens is formed integrally with the connection portion.

Optionally, the lens is separated from the connection portion and located between the connection portion and the base, and is fixedly connected with the base by the connection portion.

Optionally, the connection portion and the base form a snap structure mated with one another so that the lens group is connected to the base.

Optionally, a fastener disposed between the lens group and the base is also included, and the fastener fixedly connects the connection portion and the base.

Optionally, one surface of the flame retardant film is provided with an adhesive backing and is bonded to the base by the adhesive backing.

Optionally, the flame retardant film can partially cover at least a surface on one side of the base.

Optionally, a waterproof joint is also included, the waterproof joint being connected with the base and being electrically connected with the LED luminary unit.

Optionally, the LED luminary unit includes at least one LED lamp bead, or at least one LED chip containing phosphors, or a COB, or is formed by multiple LED lamp beads with different color temperatures or is formed by multiple LED chips containing phosphors with different color temperatures.

Optionally, a heat dissipation structure is provided on one side of the base that relative to the first side of the base.

The present invention has at least the following beneficial effects:

1. The LED module is provided with the flame retardant film, which can effectively cut off circuit sparks generated by circuits on a printed circuit layer or by a PCB board, thus reducing the security risks.
2. The module with a high protection class has high flame retardant grade after being provided with the flame retardant film.
3. The LED module has a simple structure and is easy to process and implement.

Figure 1:
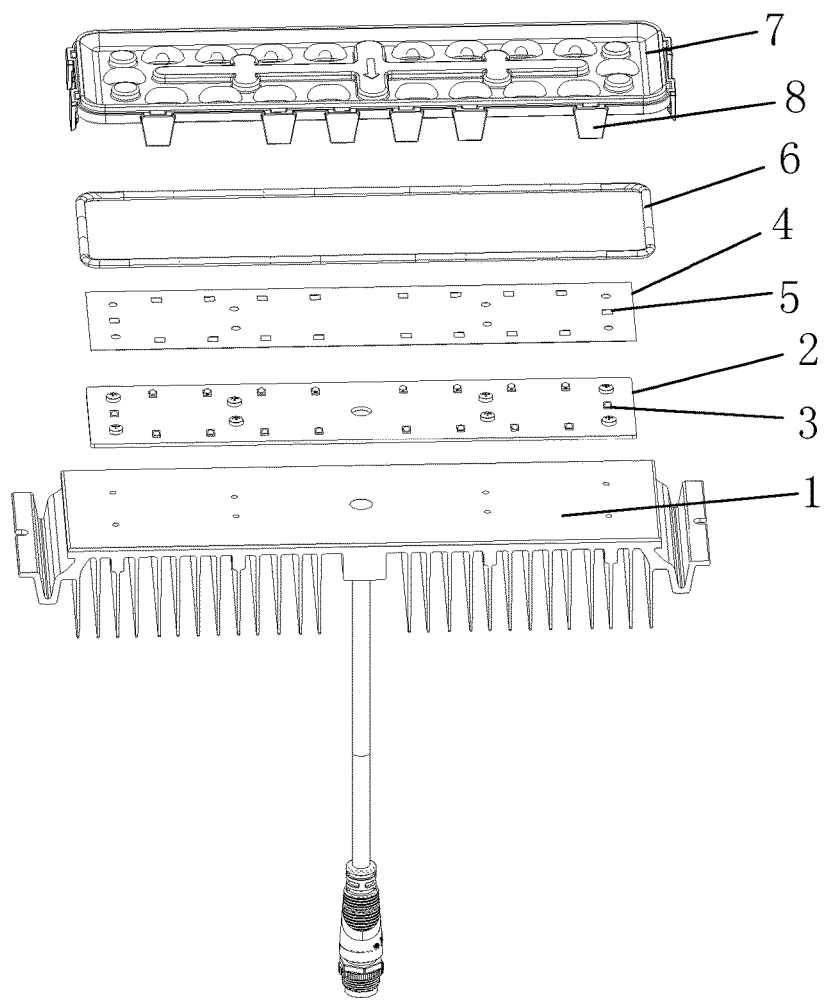
FIGS. 1 and 2 are structural schematic diagrams of an LED module with high flame retardant grade in one embodiment of the present invention.

In the drawings, 1-base; 2-substrate; 3-LED luminary unit; 4-flame retardant film; 5-hole; 6-seal ring; 7-lens group; 8-snap; 9-connection structure; 10-groove.

DETAILED DESCRIPTION OF THE INVENTION

Hereinafter, the LED module with high flame retardant grade provided by the present invention will be described in detail with reference to FIGS. 1 to 4, which is an optional embodiment of the present invention. It can be considered that, without altering the spirit or scope of the present invention, the LED module can be modified and polished by those skilled in the art.

Figure 2:
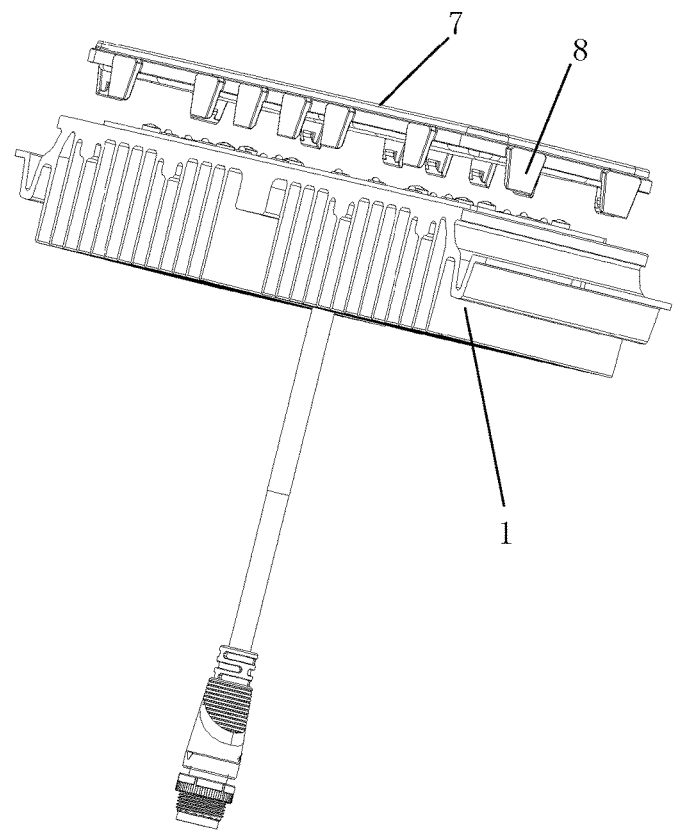
Figure 3:
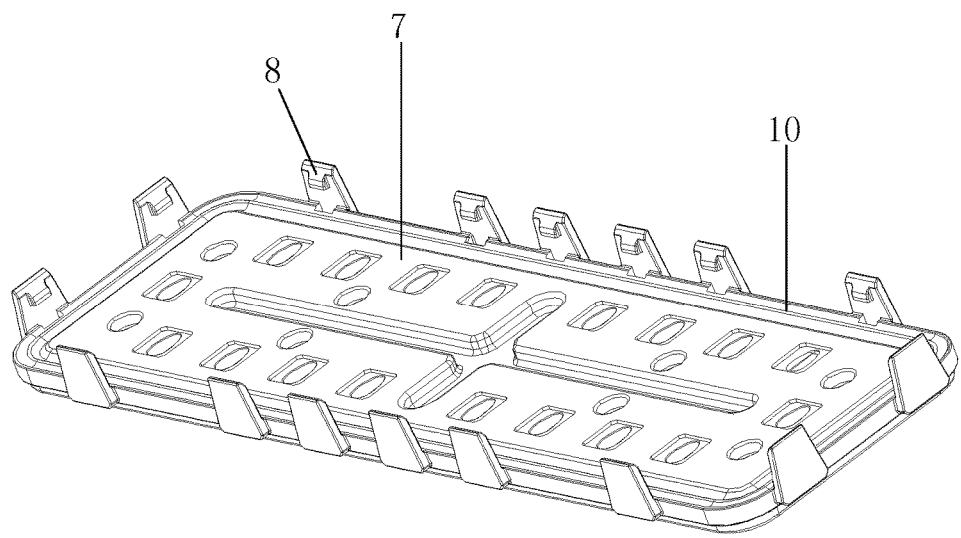
FIG. 3 is a structural schematic diagram of a lens group and a snap in one embodiment of the present invention.
Figure 4:
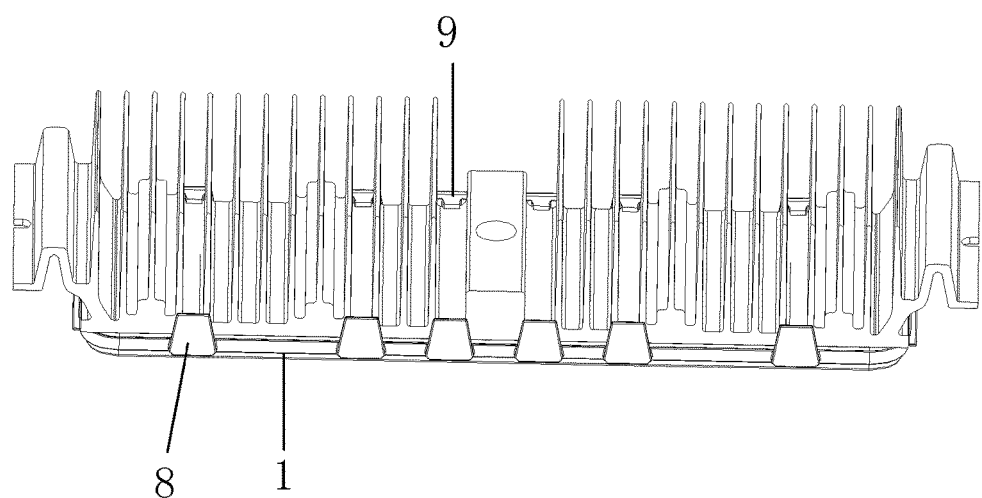
FIG. 4 is a structural schematic diagram of a snap, a connection structure and a base in one embodiment of the present invention.

Referring to FIGS. 1 and 2, the present invention provides an LED module with high flame retardant grade, which includes at least a base 1, a substrate 2, a flame retardant film 4, a seal ring 6, a lens group 7 and a plurality of LED luminary units 3, wherein the substrate 2 is mounted on a first side of the base 1, the flame retardant film 4 and the LED luminary units 3 are provided on one side of the substrate 2 that opposite to the base 1, and the lens group 7 is covered by the first side of the base 1, forming a closed space; the substrate 2, the flame retardant film 4 and LED luminary units 3 are all located in the closed space, and the base 1 includes at least two sides, one side covering the lens group 7 is the first side as previously discussed, and the other side opposite to the first side is a second side; and the first side can also be considered as an inner side and the second side can be considered as an outer side; as the shape of the base 1 changes, all or part of outer surface of the base 1 outside of the closed space can be considered as outer sides, i.e. the second side as described above, but are not limited to two opposite sides illustrated by FIGS. 1 and 2.

The seal ring 6 is provided between the lens group 7 and the base 1 and surrounds the outer side of the substrate 2; a connection section between the lens group 7 and the base 1 is thereby filled, further sealing the closed space;

a plurality of holes 5 are provided on the flame retardant film 4, the plurality of holes 5 being correspondingly matched with the plurality of the LED luminary units 3; thereby after the assembly is completed, each LED luminary unit 3 correspondingly passes through the holes 5, and then emits light inside the lens group 7. The matching referred to herein includes at least a matching of size, shape and number, etc., but is not limited thereto, and is not limited to a one-to-one relationship, such as the corresponding relationship between LED luminary units 3 and holes 5, for example in a technical solution, a row of LED luminary units 3 can correspond to a long or large hole 5, which is also one of the alternatives described in the present invention. In addition, the LED luminary units 3 can be provided with only one.

The second side of the base 1 is provided with a heat dissipation structure, and in other optional embodiments, if the module itself does not have the heat dissipation structure, the module is mounted on a module mounting surface of the lamp.

In order to achieve a stable assembling effect, one surface of the flame retardant film 4 is provided with an adhesive backing (not shown) and is bonded to the substrate 2 by the adhesive backing. The substrate in this embodiment is particularly a PCB board on which a circuit is printed, the circuit being used to connect with the LED luminary units to supply power thereto. In other preferred embodiments, the substrate is used only for carrying the LED luminary units, and the circuit for supplying power to the LED luminary units may be provided separately or directly provided on the base. The flame retardant film 4 covers at least the surface on one side of the substrate 2. Sealing glue (not shown) is provided between the base 1 and the lens group 7. In order to increase the sealing effect, referring to FIG. 3, a groove 10 matched with the seal ring 6 is provided on the lens group 7. In one preferred embodiment, one surface of the flame retardant film is provided with an adhesive backing and is directly bonded to the base by the adhesive backing without providing a substrate. In addition, in one embodiment without a substrate, the flame retardant film can partially or completely cover at least a surface on one side of the base, but can at least partially cover the surface on one side of the base. When there is no substrate, the LED luminary is directly provided on the base, at this time, the heat generated when the LED luminary emits light can be directly transmitted to the base, with a better thermal conductivity and heat dissipation performance.

Referring to FIGS. 1 to 4, in this embodiment, the outer side of the lens group 7 is provided with a plurality of snaps 8 along the circumference direction, and the base 1 is provided with a connection structure 9 matched with the snaps, the snap 8 being engaged with the connection structure 9 in a matching way. The connection structure 9 may vary according to the various snap 8, and is not limited to the particular form illustrated in the drawings. Certainly, in other optional embodiments of the present invention, the adoption of other connection means, rather than the adoption of matching engagement of the snap or even fixing by connection ways, may fall within the scope of the present invention.

In another optional embodiment of the present invention, the above-mentioned substrate is replaced by a printed circuit layer provided on the first side of the base, particularly, which may be a printed circuit directly printed on the base, or an individual printed circuit layer separated from the base, or a circuit layer partially printed on the base; wherein the printed circuit layer is electrically connected with the above-mentioned luminary units and is mainly used for supplying power to allow the luminary units to emit light. In this embodiment, the flame retardant film is covered on the printed circuit layer. Preferably, the LED module further includes an insulation layer provided on the base, and the above-mentioned printed circuit layer is coated in the insulation layer. More preferably, the above-mentioned insulation layer and the printed circuit layer are located only in the closed space formed between the lens group and the base.

In another optional embodiment of the present invention, the lens group comprises a lens and a connection portion, wherein the lens is used for photometry of the LED luminary units, the above-mentioned closed space is located between the lens of the lens group and the base, and the connection portion is used for connecting the lens group and the base. Preferably, a circle of glue receiving portion is provided between the connection portion and the base, which is used for receiving the glue to be respectively bonded to the lens group and the base. Alternatively, a seal ring is provided between the base and the lens group, while the above-mentioned closed space is located on the inner side of the seal ring. In this case, a circle of glue receiving portion may also be provided on the inner side or on the outer side of the seal ring for receiving the glue to be respectively bonded to the lens group and the base. The above-mentioned glue receiving portion may be a groove capable of receiving the glue with a rectangular or triangular or semicircular cross-section, or the surface thereof may be a rough surface on which the glue is relatively easy to be retained with respect to other positions nearby. In the present invention, the specific embodiment of the glue receiving portion is not particularly limited. The variations made by those skilled in the art in accordance with the above-mentioned embodiments are included within the scope of the present inventions. Certainly, the glue may also be directly coated between the connection portion and the base or may be coated on the inner side or on the outer side of the seal ring to be respectively bonded to the lens group and the base.

In another optional embodiment of the present invention, the lens is formed integrally with the connection portion, for example, the lens is casted integrally with the connection portion during casting process, or the lens and the connection portion are made into an integrated structure in a rolling way; Alternatively, the lens is separated from the connection portion and located between the connection portion and the base, and is fixedly connected with the base by the connection portion. At this time, the connection portion and the lens are mutually independent, and the connection portion is connected with the lens while being connected with the base, for example a plurality of fixing slots corresponding to the lens are provided on a connection portion. During the mounting process, the lens is arranged under the fixing slots, and when the connection portion is connected to the base, the lens can be fixed by these slots and be pressed onto the base. It is certainly not limited thereto, and those skilled in the art can also fix the lens in other similar ways as desired and according to the teaching of the above-mentioned embodiments.

In another optional embodiment of the present invention, a fastener provided between the lens group and the base is also included, which is used for connecting the connection portion and the base. Preferably, gaskets provided between the fastener and the lens group are also included. Herein the number of the gaskets is at least one, wherein at least two fasteners corresponds to one of the gaskets. The gaskets are plate-like, at least two fasteners pass through the same plate-like gasket, and the plate-like gaskets are locked between the fastener and the connection portion. The materials of the gaskets are preferably metallic materials.

In another optional embodiment of the present invention, the LED module with high flame retardant grade further includes a waterproof wiring with one end being connected to the outside, the waterproof wiring passing through the base land being connected onto the base 2.

In another optional embodiments of the present invention, a waterproof joint is also included, the waterproof joint being connected with the base and being electrically connected with the LED luminary units. Preferably, the waterproof joint is provided outside the base, and is connected and communicated with the substrate 2 or the printed circuit layer or the PCB board through a wiring or directly connected with the base on which the printed circuit layer is printed, so as to be electrically connected with the LED luminary units.

According to different external connection needs and wiring ways, any one of the above two embodiments may be arbitrarily configured without departing from the scope of the present invention whichever embodiment is selected.

The LED luminary unit 3 includes at least one LED lamp bead, or at least one LED chip containing phosphors, or a COB, or is formed by multiple LED lamp beads with different color temperatures or is formed by multiple LED chips containing phosphors with different color temperatures. Various designs of the LED luminary unit 3 are enumerated herein, and different specific designs can be used according to different scenes. However, the present invention is not limited to the above enumeration, as any LED that is used for emitting light can be regarded as the LED luminary unit 3.

The operation principle of the flame retardant film of above-mentioned embodiments to achieve flame retardance is as follows: the combustion of the LED module is generally caused by the sparks generated by the circuit for failures of the printed circuit layer on the substrate circuit or the base or caused by the overheating of the substrate/base, which causes the combustion of the lens group. By providing a flame retardant film on the substrate/base, the spark generated by the substrate/base circuit is prevented, or the rapid transmission of heat generated by the overheating of the substrate/base to the lens group is prevented, thereby preventing the lens group from reaching the ignition temperature, thus preventing the combustion of the lens group.

In summary, the present invention has at least the following beneficial effects:

1. The LED module is provided with a flame retardant film, which can cut off circuit sparks, reducing the security risks.

2. The module with a high protection class has high flame retardant grade after being provided with a flame retardant film.

3. The method is simple and is easy to operate and achieve.

The foregoing are only specific embodiments of the present invention, but the protection scope of the present invention is not limited thereto, all variations and substitutions of the present invention made by those skilled in the art should fall within the protection scope of the present invention. Therefore, the protection scope of the present invention shall be subject to the protection scope defined by the claims.

The invention claimed is:

1. An LED module with high flame retardant grade, comprising a base and a lens group, wherein the LED module further comprises a flame retardant film and at least one LED luminary unit, the flame retardant film being provided on a first side of the base with at least one hole being provided on the flame retardant film, the LED luminary unit being provided on the first side of the base and passing through the hole, the lens group being covered onto the first side of the base, and a first closed space being formed between the lens group and the base, wherein the lens group comprises a lens and a connection portion, the lens being used for photometry of the LED luminary unit, the first closed space being located between the lens and the base, and the connection portion being used for connecting the lens group and the base.

2. The LED module with high flame retardant grade of claim 1, wherein the LED module further comprises a printed circuit layer disposed on the first side of the base, the LED luminary unit being electrically connected with the printed circuit layer, and the flame retardant film covering on the printed circuit layer.

3. The LED module with high flame retardant grade of claim 2, wherein the printed circuit layer is located only in the first closed space between the lens group and the base.

4. The LED module with high flame retardant grade of claim 1, wherein the LED module further comprises a PCB board disposed on the base, the PCB board being located between the base and the lens group, the flame retardant film covering on the PCB board, and the at least one LED luminary unit being disposed on the PCB board.

5. The LED module with high flame retardant grade of claim 1, wherein a heat dissipation structure is provided on the second side of the base opposing to the first side of the base.

6. The LED module with high flame retardant grade of claim 1, wherein a seal ring is provided between the base and the lens group, the first closed space being located on the inner side of the seal ring.

7. The LED module with high flame retardant grade of claim 6, wherein a circle of glue is provided on the inner side or on the outer side of the seal ring and between the base and the lens group, the glue being respectively bonded to the lens group and the base.

8. The LED module with high flame retardant grade of claim 1, wherein a circle of glue is provided between the connection portion and the base, the glue being respectively bonded to the lens group and the base.

9. The LED module with high flame retardant grade of claim 1, wherein the lens is formed integrally with the connection portion.

10. The LED module with high flame retardant grade of claim 1, wherein the lens is separated from the connection portion and located between the connection portion and the base, and is fixedly connected with the base by the connection portion.

11. The LED module with high flame retardant grade of claim 1, wherein the connection portion and the base farm a snap structure mated with one another so that the lens group is connected to the base.

12. The LED module with high flame retardant grade of claim 1, wherein the LED module further comprises a fastener disposed between the lens group and the base, and the fastener fixedly connects the connection portion and the base.

13. The LED module with high flame retardant grade of claim 1, wherein one surface of the flame retardant film is provided with an adhesive backing and is bonded to the base by the adhesive backing.

14. The LED module with high flame retardant grade of claim 1, wherein the flame retardant film partially covers at least a surface on a second side of the base opposing to the first side of the base.

15. The LED module with high flame retardant grade of claim 1, wherein a waterproof joint is also included, the waterproof joint being connected with the base and being electrically connected with the LED luminary unit.

16. The LED module with high flame retardant grade of claim 1, wherein the LED luminary unit comprises at least one LED lamp bead, or at least one LED chip containing phosphors, or a COB, or is formed by multiple LED lamp beads with different color temperatures or is formed by multiple LED chips containing phosphors with different color temperatures.

* * * * *